United States Patent [19]

Kraus et al.

[11] 4,286,306

[45] Aug. 25, 1981

[54] CIRCUIT ARRANGEMENT FOR COMPARING THE SYNCHRONISM OR TRACKING BETWEEN TWO ANALOG SIGNALS

[75] Inventors: Hermann Kraus, Ottobrunn; Peter Kirchlechner, Siegertsbrunn; Robert Rieger, Aying; Wolf-Dieter Schuck, Neubiberg, all of Fed. Rep. of Germany

[73] Assignee: Messerschmitt-Boelkow-Blohm Gesellschaft mit beschraenkter Haftung, Munich, Fed. Rep. of Germany

[21] Appl. No.: 62,497

[22] Filed: Jul. 31, 1979

[30] Foreign Application Priority Data

Aug. 9, 1978 [DE] Fed. Rep. of Germany ....... 2834805

[51] Int. Cl.³ .............................................. B60K 31/00
[52] U.S. Cl. ..................................... 361/242; 324/161
[58] Field of Search ................ 361/242, 239; 180/179; 324/160, 161, 163

[56] References Cited

U.S. PATENT DOCUMENTS

| | | | |
|---|---|---|---|
| 3,450,943 | 6/1969 | Burke et al. | 361/242 |
| 3,919,634 | 11/1975 | Appel et al. | 361/239 X |
| 4,157,126 | 6/1979 | Collonia | 361/242 X |
| 4,170,274 | 10/1979 | Collonia | 324/161 X |

Primary Examiner—L. C. Schroeder
Attorney, Agent, or Firm—W. G. Fasse; D. F. Gould

[57] ABSTRACT

The synchronism or tracking between two analog signals is compared by a circuit arrangement having two inputs to which these analog signals are applied. A comparator circuit compares the two signals and provides a trigger or energizing signal to a switch which in turn produces an error signal when the two compared signals deviate from each other to an extent larger than a predetermined limit. One input is connected to the comparator circuit through a heterodyning circuit wherein the respective analog signal is heterodyned by a heterodyning signal which varies in its polarity. The comparator circuit includes a polarity detector which provides a signal signifying a positive or a negative difference between the amplitudes of the two polarity signals. A discriminator circuit is operatively connected to the comparator to provide a switch energizing signal when the difference signal does not have any zero transitions or passages with the frequency of the heterodyning signal.

16 Claims, 8 Drawing Figures

CIRCUIT ARRANGEMENT FOR COMPARING THE SYNCHRONISM OR TRACKING BETWEEN TWO ANALOG SIGNALS

BACKGROUND OF THE INVENTION

The invention relates to a circuit arrangement for comparing the synchronism or tracking between two analog signals. Such a circuit comprises two inputs to which the respective analog signals are applied for supplying these analog signals to a comparator which is connected to a switch for producing an error signal in response to a determined deviation between the two signals.

It is frequently necessary to check and monitor the synchronism or tracking between two or more analog signals or measured values which are dependent upon one another. Such checking and monitoring may be necessary in manufacturing operations, in the process technology, for example, in chemical engineering, and in control engineering generally.

If the signals to be monitored deviate from one another to an extent which falls outside a certain tolerance frame, a switch or switching circuit or device makes sure that either the entire operation that is to be monitored is interrupted or that such operation is returned automatically to the desired rated value.

Thus, for example, in connection with transit systems, cabin taxis, and similar systems the fully automatic operations of the vehicle make it necessary to monitor the operation since the vehicles travel without an operator. For this purpose, for example, the speed and the spacing or distance between two vehicles one of which follows the other, are constantly measured and monitored to prevent a collision of the vehicles. Such a monitoring must provide an inherent safety feature. Stated differently, it must be assured that a collision of the vehicles cannot occur in fact if a failure should occur or if the used circuits include a source of error. To provide this assurance, it is customary to ascertain and monitor each value that must be monitored in at least two channels in order to be able to ascertain and process the correct data at least through one channel if the other channel fails or is subject to a defect.

In addition to the above mentioned problem of achieving the fail-safe feature, there is the problem that the measured data or values involved cover a large dynamic range. Thus, when monitoring the speed of a vehicle in a cabin taxi system, the output signal, for instance of a tacho-generator may vary between a zero value and 10 volts. Such a range is monitored between 100 millivolts corresponding to the smallest speed yet to be taken into account and 10 volts corresponding to the maximum speed. The above mentioned type of circuit arrangement must make it possible to ascertain whether the synchronism or tracking between the two analog signals is still present within the entire just mentioned range. This type of requirement calls for a complex circuit structure which must be tuned so to speak to the individual dynamic ranges.

In addition, it must be taken into account that the two analog signals normally are permitted to differ within relative and absolute tolerance limits. Such tolerance limits differ depending on the type of monitoring. These limits are determined by the special dimensioning of the circuit arrangement.

OBJECTS OF THE INVENTION

In view of the above it is the aim of the invention to achieve the following objects singly or in combination:

to provide a circuit arrangement of the type mentioned above which shall be simple in its structure yet reliable through a wide dynamic range while simultaneously providing a fail-safe feature;

to provide a circuit arrangement for the monitoring of the synchronism or tracking between two or more analog signals whereby the tolerance limit for permissible variations of the monitored analog signals may be adjusted in a simple manner;

to adjust the relative tolerance limit by adjusting a modulation index;

to provide a fixed tolerance threshold by an additive heterodyning and to provide a determined tolerance threshold by the constant amplitude of a heterodyning signal; and to provide a circuit arrangement which permits in a simple manner to determine an absolute tolerance frame for two or more analog signals, for example, to provide an absolute tolerance for the difference between the two signals.

SUMMARY OF THE INVENTION

According to the invention there is provided a circuit arrangement for comparing the synchronism or tracking of two analog signals including a comparator circuit having two inputs for said analog signals. An error signal switch is operatively connected to the comparator output for producing an error signal when the deviation between the two signals exceeds a certain limit value. At least one input is connected to the comparator circuit through a heterodyning circuit wherein the respective analog signal is heterodyned with a heterodyning signal of alternating polarity. The comparator circuit includes a polarity detector which provides a signal representing a positive or negative difference between the amplitudes of the two analog signals. A discriminator circuit is operatively connected to the output of the comparator circuit to supply a switching signal to the error signal switch if and when the difference signal does not exhibit any zero transitions having the frequency of the heterodyning signal.

BRIEF FIGURE DESCRIPTION

In order that the invention may be clearly understood, it will now be described, by way of example, with reference to the accompanying drawings, wherein:

FIG. 1 is a block circuit diagram of a circuit arrangement for comparing the synchronism or tracking of two analog signals according to a first embodiment of the invention;

FIGS. 2a, 2b, and 2c illustrate pulse time diagrams for illustrating the processing of the two analog signals in a circuit arrangement according to the invention;

DETAILED DESCRIPTION OF PREFERRED EXAMPLE EMBODIMENTS AND OF THE BEST MODE OF THE INVENTION

Figure 1:
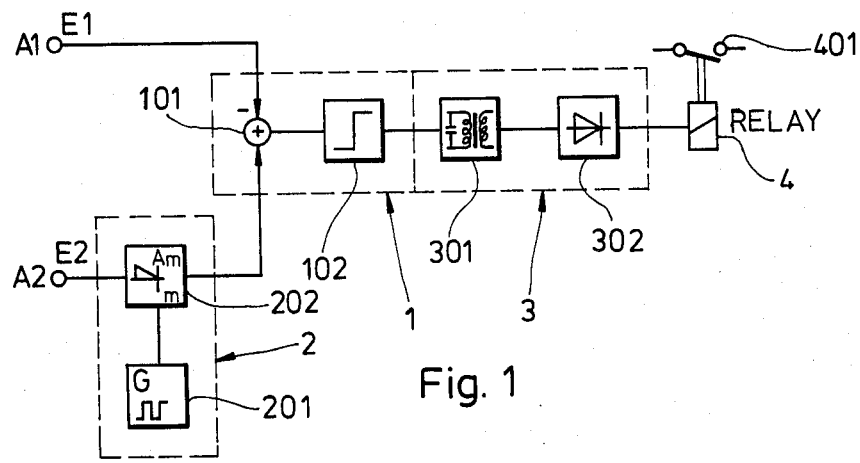

The circuit according to FIG. 1 for comparing the synchronism or tracking between two analog signals A1 and A2 comprises two inputs E1 and E2. The analog signal A1 is applied to the input E1. The analog signal A2 is applied to the input E2. The input E1 is connected to one input of a difference forming stage 101 of a comparator 1. The comparator 1 further comprises, in addition to the difference forming stage 101, a polarity detector 102 the input of which is connected to the output of the difference stage 101. The second input E2 of the circuit arrangement is connected through a heterodyning stage 2 to the second input of the difference forming stage 101. The heterodyning stage comprises a square wave generator 201 and a modulator 202 connected with one input to receive the second analog signal A2 and with the other input to receive the square wave signal from the generator 201.

The output of the polarity detector 102 of the comparator 1 is connected to a discriminator circuit 3 comprising a buffer transformer constructed as a resonance transformer 301 and a rectifier circuit 302 connected to the output of the resonance transformer 301.

The output of the rectifier 302 is connected to energize a relay 4 having a make-contact 401 which is kept closed when the rectifier 302 provides at its output a positive output signal.

Figure 2A:
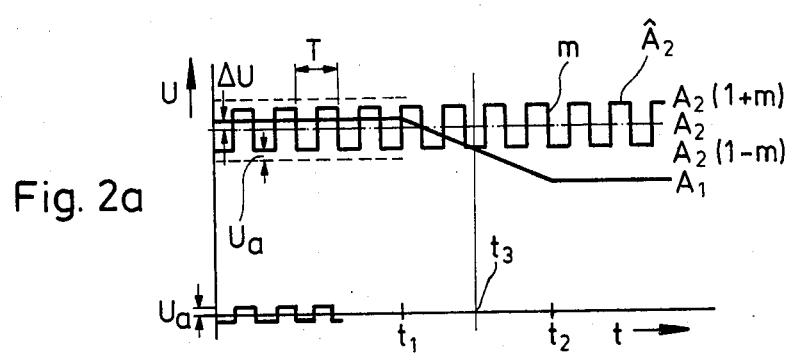

The function or operation of the circuit arrangement shown in FIG. 1 will now be explained in more detail with reference to FIGS. 2a, 2b, and 2c. The analog signal A1 is shown in FIG. 2a by a full line. The analog signal A2 is shown by a dash-dotted line in FIG. 2a. The analog signals A1 and A2 correspond about to the rated signal and to the measured signal respectively of the speed of a vehicle of a cabin taxi. These two analog signals are ascertained in two ways independent of each other. The analog signal A2 is heterodyned in a multiplicative manner by the heterodyning signal in the form of a square wave G generated by the square wave generator 201. The period T of the heterodyning signal is determined by the frequency of the square wave generator 201. The respective amplitude of the square wave signal is determined by the modulation index m of the modulator 202. As a result of this heterodyning the modulated signal Â2 is obtained which varies between the values A2(1+m) and A2(1+m). These values determine the permissible tolerance for the analog signals.

Up to the time $t_1$ the two analog signals have constant values. During this time the two signals differ from each other merely by the value ΔU which, however, is within the relative tolerance limit defined or predetermined by the modulation index m. Starting with the time $t_1$ and continuing to the time $t_2$ the analog signal A1 continuously diminishes. At the time $t_2$ the analog signal A1 assumes again a constant value. During these times the analog signal A2 remains constant as indicated by the dash-dotted line.

The signals A1 and Â2 are supplied to the difference forming network 101 of the comparator circuit 1. The output signal U101 of the comparator circuit 1 is the difference between the signals Â2 and A1 as shown in FIG. 2b. The signal U101 is a modulated impulse signal the center line of which deviates upwardly at the time $t_1$ in accordance with the positive difference of the output signals at the output of the difference forming network 101. This output signal U101 exhibits until the time $t_3$ positive and negative components having respective zero transitions because the analog signal A1 is still within the tolerance limits determined by the modulation index m until the point of time $t_3$.

Following the time $t_3$ the analog signal A1 passes outside the tolerance frame and as a result the output signal U101 of the difference forming stage 101 is a modulated signal having positive components only.

At the time $t_3$ it becomes necessary to take positive steps in the system being monitored. For this purpose the output signal U101 is supplied to the polarity detector 102. Until the time $t_3$ the output signal U102 of the polarity detector 102 is a difference signal having a constant amplitude and alternating with the heterodyning frequency as shown in FIG. 2c. This difference signal alternates in its polarity in accordance with the positive and negative components of the signal U101 supplied by the difference forming stage 101. However, starting at the time $t_3$ the signal U101 exhibits only positive components. Therefore the output signal U102 of the polarity detector 102 also exhibits only a positive component.

The signal U102 of the polarity detector is supplied to the resonance transformer 301. The primary winding of the resonance transformer forms with a capacitor a resonance circuit as is shown in the block 301 and as is well known in the art. The frequency of the resonance circuit is tuned to the heterodyning frequency of the heterodyning circuit 2. As long as the output signal U102 of the polarity detector 102 alternates with this heterodyning frequency, a signal appears at the output of the resonance transformer 301. This output signal of the resonance transformer 301 is supplied to the rectifier 302 which in turn keeps the relay 4 energized. However, at the time $t_3$ the oscillation of the output signal U102 is interrupted whereby the output signal of the resonance transformer 301 becomes zero. Thus, the relay 4 is deenergized and the make-contact 401 is opened. In the case where the switch or contact 401 monitors the speed of a vehicle in a cable car system, as mentioned above, the opening of the contacts 401 may signal that one of the two channels for measuring the rated and the actual speed of a vehicle is defective. In response to such signal the respective vehicle may be automatically stopped or it may be brought into a safe condition.

The circuit arrangement just described has the advantage that the relay 4 will generally be also deenergized if any defect occurs in the circuit arrangement whereby the signals do not positively pass through the circuit system.

Figure 3:
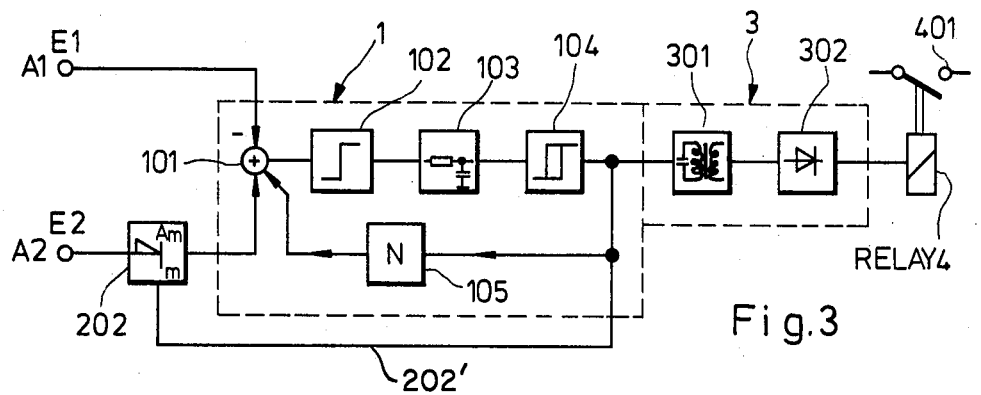
FIG. 3 is a block diagram of a circuit arrangement illustrating a second embodiment according to the invention.

FIG. 3 illustrates a further embodiment according to the invention constructed to provide a self oscillating system. The circuit elements which correspond to the same circuit elements in FIG. 1 also have the same reference numbers to signify that these elements are identical. Elements which merely perform a similar function are provided with a prime (') in their reference number. The two output signals A1 and A2 are again supplied through the two inputs E1 and E2 into the circuit whereby the input E1 is directly connected to the difference forming network 101' of the comparator 1'. The input E2 is supplied through a modulator 202 having the modulation index m, the output of the modulator 202 is connected to the difference forming stage 101'. The output of the difference forming stage 101' is again connected to the polarity detector 102. The output of the polarity detector 102 is connected to an integrating circuit 103 which in turn is connected to a Schmitt-trigger 104. The output of the Schmitt-trigger 104 is connected through a feedback conductor 202 to one input of the modulator 202. Thus, the heterodyning signal controlling the modulator 202 for modulating the second analog signal A2 is supplied by the Schmitt-trigger 104. Due to this feedback an oscillation is generated the frequency of which depends on the time constant of the integrator 103 and on the hysteresis of the Schmitt-trigger 104. Thus, the square wave generator 201 of the embodiment of FIG. 1 has been replaced in the embodiment of FIG. 3 by the integrator 103 and the Schmitt-trigger 104 and the self oscillating feedback circuit arrangement.

Figure 4:
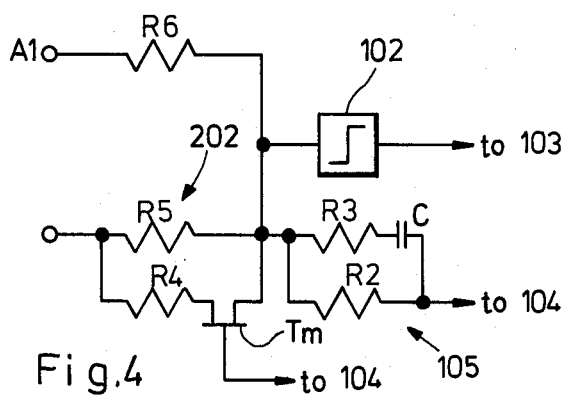
FIG. 4 is a schematic circuit diagram of an input stage including a modulator suitable for use in the embodiment of FIG. 3.

Referring to FIG. 4 the heterodyning circuit 202 comprises a field effect transistor $T_m$ the gate electrode of which is connected to the output of the Schmitt-trigger 104. The channel terminal of the transistor $T_m$ is connected in series with a resistor R4. This series connection is in turn connected in parallel with a resistor R5 interposed between the input E2 and the input of the polarity detector 102. A further resistor R6 is connected between the input E1 and the input of the polarity detector 102. Thus, the resistors R5 and R6 form the differencing network 101'. The construction of the modulator 202 as an electronic resistor with the transistor T as shown in FIG. 4 has the advantage that the positive feedback causing the self oscillation turns into a negative feedback which interrupts the self oscillation when the gate electrode of the transistor $T_m$ is conductively connected to the transistor output.

The signal processing takes place in the circuit arrangement of FIG. 3 substantially in the same manner as in FIG. 1. As long as the two analog signals A1 and A2 are synchronized within the given or predetermined tolerance frame, an alternating voltage signal is applied to the primary winding of the resonance transformer 301 which is tuned to the heterodyning frequency. As long as this input signal to the resonance transformer 301 has the heterodyning frequency, an output signal is provided at the secondary winding of the transformer 301 and the rectifier 302 provides a signal to keep the relay 4 energized and the contact 401 closed. However, if one of the analog signals A1, A2 deviates from the other analog signal to an extent outside the tolerance frame, the polarity detector 102 provides a constant signal which is integrated by the integrator 103 and supplied to the Schmitt-trigger 104. As a result of the continuous signal integration, the oscillation is interrupted through the Schmitt-trigger 104 by discontinuing the feedback so that no output signal appears at the secondary winding of the resonance transformer 301. Thus, the relay 4 is deenergized as described and the make-contact 401 opens causing the above mentioned control functions, for example, stopping the vehicle.

Figure 5:
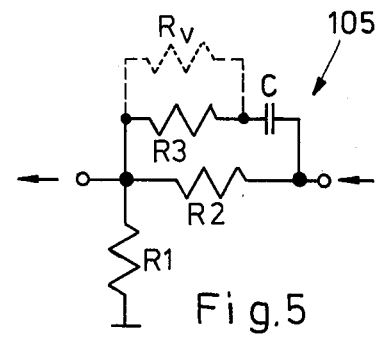
FIG. 5 is a circuit arrangement of a feedback network of the circuit arrangement according to FIG. 3.

As shown in FIGS. 3 and 4 the comparator 1' also comprises a network 105 connecting the output of the Schmitt-trigger 104 to a reference input of the difference forming stage 101'. The network 105 serves on the one hand for the adjustment of an absolute tolerance frame for the two analog signals. On the other hand this network serves for switching off the comparator 1 in accordance with a hysteresis function. In FIG. 4 the network 105 comprises the resistor R2 connected in parallel to the series connection of a resistor R3 and a capacitor C. In FIG. 5 the network 105 comprises a voltage divider R1 and R2 of which the series resistor R2 is again connected in parallel to an RC-network including the resistor R3 and the capacitor C. The just described network determines an absolute tolerance frame for the analog signals A1 and A2 since the valuating or reference threshold, namely, the reference characteristic of the difference forming network 101' is additionally displaced in response to the input voltage Ua supplied by the network 105 and shown in FIG. 2a. This voltage Ua fixes the tolerance frame and is an alternating signal which is added to the heterodyning signal whereby the entire tolerance frame is determined by the sum of the relative and the absolute tolerance frames.

Figure 2B:
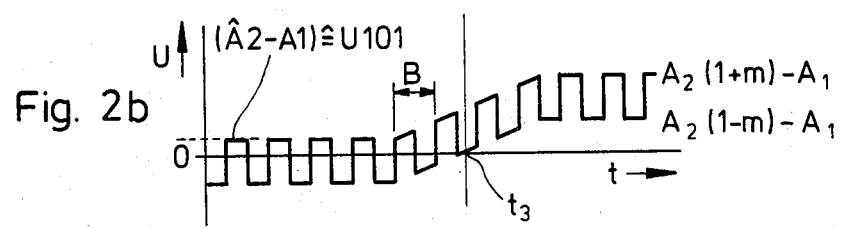
Figure 2C:
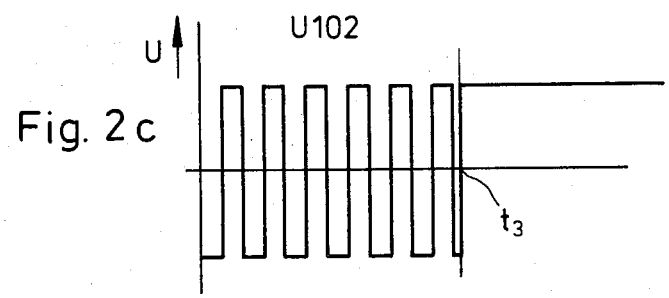

With regard to FIGS. 2a, 2b, and 2c it should be mentioned that these illustrations are not to scale, but merely serve for explaining the monitoring as a function of absolute and relative tolerances. Especially the deviation of the two analog signals from each other and the ratio of the absolute error to the relative error is not shown in accordance with any given scale.

As long as the analog signals A1 and A2 are synchronized with each other within the range predetermined by the relative and absolute tolerance frame, the output signal of the comparator 1' will be an alternating voltage signal which is supplied through the resonance transformer 301 and the rectifier 302 of the discriminator circuit 3 to the relay 4 whereby the latter remains energized and the make-contact 401 closed. However, when the oscillation caused by the feedback in the comparator 1' stops, the relay 4 is deenergized with the above described consequences. In addition, the parallel connection of the resistor R3 to the resistor R2 in the network 105 is made ineffective when the oscillation stops, whereby the absolute tolerance frame is now only determined by the parallel connection of the resistors R1 and R2 whereby this absolute tolerance frame is made smaller. The comparator 1' will be switched on again only under these circumstances when the analog signals A1 and A2 are within the narrower absolute tolerance frame. "Narrower" in this context has reference to the tolerance frame determined by the parallel connection of the resistors R2 and R3. By this feature it is assured that the circuit arrangement is made operable again only if the difference between the two analog signals A1 and A2 is smaller than an absolute error value determined by the parallel connection of the resistors R2 and R3.

FIG. 4 shows an input circuit for the embodiment of FIG. 3. The relative tolerance frame is determined by the values of the resistors R4 and R5. The absolute tolerance frame is determined by the value of the resistors R1, R2, and R3, whereby R1 is not explicitly shown in FIG. 4 but only in FIG. 5. R1 is to be considered as an equivalent resistance for the mean value of the parallel resistors R4, R5, and R6 or for the resistor R6. All of these resistors may be adjustable in their value. FIG. 4 further shows that when one of these resistors becomes defective, that is, when one of these resistor values becomes larger, the entire resistance value of the network 105 is influenced thereby in such a manner that the respective tolerance frame of the analog signal comparator 1' becomes smaller. This feature of the invention also provides an additional safety factor for the system being monitored because the described circuit arrangement is unlocked so to speak only when both of the two analog signals which are being monitored correspond to each other within the narrowed tolerance limit.

The resistors R1, R2, and R3 may be adjusted by means of an external resistor or resistance Rv. These resistors are also connected in such a manner that upon failure of one of the resistors, the total resistance of the network is influenced in such a manner that the tolerance frame becomes smaller, please see FIG. 5 in which the resistor R3 may be replaced by an adjustable resistor Rv indicated by dashed lines.

Figure 6:
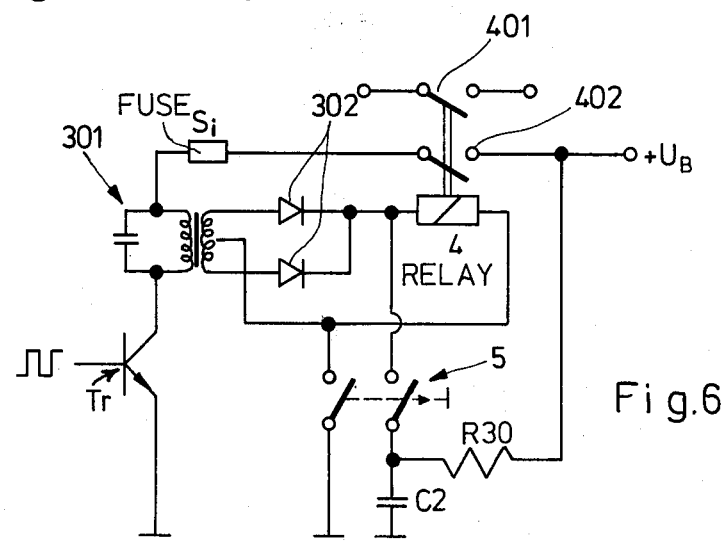
FIG. 6 is a discriminator circuit including a resonance transformer and a relay for use in a circuit arrangement according to the invention.

FIG. 6 is an example embodiment of a circuit arrangement comprising a resonance transformer 301 followed by a two-way rectifier 303 and triggered by a driver transistor Tr. The relay 4 is connected for energization by the two-way rectifier 302. The relay 4 comprises in addition to the make-contact 401 a parallel make contact 402 which, when closed, supplies the operating voltage to the driver transistor Tr. If the relay 4 should be deenergized for any of the above mentioned causes, the operating voltage for the driver transistor Tr is interrupted in the comparator circuit. Thus, the circuit arrangement is not capable of automatically switching itself on again as was described with reference to FIG. 3. In order to reenergize the relay 4 in the embodiment of FIG. 6 and thus the circuit arrangement, it is necessary to close the circuit by means of a separate switch, such as a push-button switch 5 which may be actuated after the relay 4 has been deenergized. Actuation of the switch 5 charges the capacitor C2 through the resistor R30 from the supply battery "+$U_B$", whereby the relay is again energized to simultaneously supply the driver transistor Tr with its operating voltage so that the entire circuit arrangement is again operational if no actual defect should cause the repeated deenergization of the relay 4. The resistor R30 is so dimensioned that the current flowing through the resistor alone is not sufficient to energize the relay, such energization being accomplished by the charging of the capacitor C2. Element Si is a fuse.

In the above described example embodiments only one of the two analog signals is being modulated while the other analog signal is directly supplied to the comparator. However, it is possible to provide circuit arrangements, for example, by mere duplication, in which both analog signals are modulated in a phase synchroneous manner. Thus, it is possible according to the invention to provide different modulation indexes for the two different signals, thereby respectively establishing tolerance frames for the two analog signals. The other circuit portions remain unchanged.

In the light of the above disclosure it will be appreciated that the heterodyning may be accomplished in a multiplicative and/or in an additive manner. In the multiplicative heterodyning one of the analog signals is modulated by a heterodyning signal, the amplitude of which corresponds to the product of the amplitude of the analog signal and the modulation index or factor. By respectively selecting the value of the modulation index or factor the relative tolerances or rather the relative tolerance frame for both analog signals may be ajusted. As long as the analog signal which is not heterodyned or modulated, remains in the tolerance frame, the difference signal formed in the difference signal stage 101 or 101' exhibits zero passages or transitions having the frequency of the heterodyning signal. Thus, the synchronism or tracking of the analog signals is assured in the predetermined tolerance frame. Where an additive heterodyning is employed a fixed tolerance threshold is established whereby the constant amplitude of the heterodyning signal determines the tolerance threshold.

Due to the heterodyning or modulation of the second analog signal A2 the present circuit arrangement operates in a wide dynamic range. The permissible relative and absolute tolerance range between the two analog signals is determined in a simple manner by the amplitude of the heterodyning signal. Simultaneously the present circuit has the further advantage that it operates inherently in a fail-safe manner. Thus, if the two analog signals deviate from each other to an extent outside the permissible tolerance range, then the difference between the first and the second modulated analog signal is continuously either positive or negative so that the polarity detector 102 does not produce an alternating signal whereby the output signal of the discriminator circuit 3 also changes since the discriminator circuit is tuned to the frequency of the heterodyning signal. Stated differently, in the simplest embodiment wherein the resonance transformer is employed a signal for the switch 401 is provided. In the above mentioned example of a transit system the relay 4 is deenergized and the respective make-contact 401 is opened whereby the respective vehicle is either stopped or steps are automatically taken to return the vehicle into the desired operating condition.

As shown in FIG. 1, the multiplicative heterodyning of the second analog signal A2 may be accomplished externally so to speak by means of the square wave generated by the generator 201. However, as shown with reference to FIG. 3 the entire circuit arrangement may also be constructed to be self oscillating. In this instance, a series circuit comprising the integrator 103 and the Schmitt-trigger 104 are arranged between the output of the polarity detector 102 and the input of the discriminator 3. The output of the Schmitt-trigger is additionally connected through a feedback circuit to the control input of the heterodyning circuit 202 as described above. The comparator operation is switched off by interrupting the positive feedback in response to the two analog signals falling outside the predetermined tolerance frame.

The arrangement of FIG. 3 makes it also possible in a simple manner to establish an absolute tolerance frame for the two analog signals. Stated differently, an absolute tolerance for the difference of the two signals is determined by returning a portion of the output signal of the Schmitt-trigger to the input of the comparator as shown in FIGS. 3 and 4. Thus, on the one hand the amplitude of the feedback signal determines the absolute tolerance whereas the amplitude of the heterodyning signal determines the relative tolerance for the analog signals.

The circuit arrangement of FIG. 3 also has the fail safe feature because when a defect occurs or when a structural component of the system fails, the resulting, unpermissible frequency change of the heterodyning signal is sensed or the absence of the oscillation of the heterodyning signal is sensed whereby again an error signal is developed by means of the discriminator 3 tuned to the frequency of the heterodyning signal for the purpose of actuating a switch or the like as described.

Although the invention has been described with reference to specific example embodiments, it will be appreciated, that it is intended, to cover all modifications and equivalents within the scope of the appended claims.

What is claimed is:

1. A circuit arrangement for the comparing of the synchronism of two analog signals, comprising first and second signal input means for said two analog signals, signal comparator means, means connecting said signal input means to said signal comparator means, said connecting means comprising at least one heterodyning means operatively connecting one of said signal input means to said signal comparator means, whereby at least one of said analog signals is heterodyned by a heterodyning signal having a given frequency and an alternating polarity, said signal comparator means comprising signal difference forming means and signal polarity detecting means operatively connected to said signal difference forming means for producing a difference signal signifying a positive or negative difference between said analog signals, and discriminator circuit means operatively connected to said comparator means for producing an error signal in response to the fact that difference signal zero transitions having said given frequency of said heterodyning signal are absent, said circuit arrangement further comprising feedback circuit means operatively interconnecting said comparator means and said heterodyning means for a self-oscillating operation.

2. The circuit arrangement of claim 1, wherein said connecting means directly connect the other of said input means to said signal difference forming means.

3. The circuit arrangement of claim 1, wherein said heterodyning means provide a multiplicative modulation of one of said analog signals by said heterodyning signal, said multiplicative modulation having a modulation index m, whereby a relative tolerance frame is established.

4. The circuit arrangement of claim 1, wherein said heterodyning means provide an additive modulation of one of said analog signals, whereby an absolute tolerance level or point is established.

5. The circuit arrangement of claim 1, wherein said discriminator circuit means comprise resonance transformer means having primary winding means and secondary winding means, circuit tuning means operatively connected to said primary winding means to constitute a resonance circuit tuned to said given heterodyning frequency, and rectifier means operatively connected to said secondary winding means for producing said error signal, and switching means operatively connected to said rectifier means for responding to said error signal.

6. The circuit arrangement of claim 1, further comprising circuit means operatively connected to said circuit arrangement for adjusting the amplitude of said heterodyning signal whereby a tolerance frame may be adjusted for said analog signals.

7. The circuit arrangement of claim 1, wherein said feedback means comprise a series circuit operatively interposed between said polarity detecting means and said discriminator circuit means, said series circuit including signal integrator means having a given time constant and Schmitt-trigger means having a given hysteresis, and heterodyning means having control input means operatively connected to said Schmitt-trigger means whereby said heterodyning frequency is determined by said given time constant and by said hysteresis.

8. The circuit arrangement of claim 7, wherein said feedback means comprise branching positive feedback circuit means operatively connected to said signal difference forming means whereby a portion of the Schmitt-trigger output signal is additively fed back to said signal difference forming means for establishing an absolute tolerance frame for said analog signals.

9. The circuit arrangement of claim 8, wherein said branching positive feedback circuit means comprise a static and a dynamic resistance such, that the feedback effect is reduced in response to a failure of the self-oscillation normally caused by said feedback circuit means whereby said absolute tolerance frame is reduced.

10. The circuit arrangement of claim 9, wherein said branching positive feedback means comprise voltage divider means including at least one arm with capacitor means operatively connected in said one arm, whereby said comparator means may be switched on or off in response to said hysteresis.

11. The circuit arrangement of claim 10, wherein said voltage divider means comprise resistor means for adjusting an absolute static and an absolute dynamic tolerance frame, said resistor means comprising external, parallel, adjustable resistor means.

12. The circuit arrangement of claim 1, wherein said heterodyning means comprise field-effect transistor means operatively connected to said feedback circuit means.

13. The circuit arrangement of claim 12, wherein said field-effect transistor means are arranged to change the positive feedback of the self-oscillation into a negative feedback in response to a breakthrough between the transistor control input to the transistor output whereby said self-oscillation is interrupted.

14. The circuit arrangement of claim 1, further comprising switching means operatively connected to said discriminator circuit means for evaluating said error signal, said switching means comprising relay means energized when said analog signals are synchronous with each other and de-energized otherwise, said relay means remaining de-energized until re-energized, said switching means further comprising key switch means, capacitor means, and capacitor charging means operatively interconnected and connected to said relay means for re-energizing said relay means by normally operating said key switch means.

15. The circuit arrangement of claim 14, wherein said discriminator circuit means comprise resonance transformer means and driver transistor means operatively connected to said resonance transformer means, said relay means comprising two parallel make-contacts, and power supply means operatively connected through one of said make-contacts to said power supply means.

16. The circuit arrangement of claim 15, further comprising fuse means operatively interposed between said power supply means and said driver transistor.

* * * * *